(12) United States Patent
Agarwal et al.

(10) Patent No.: US 8,904,322 B2
(45) Date of Patent: Dec. 2, 2014

(54) STRUCTURE FOR STACKED CMOS CIRCUITS

(71) Applicant: International Business Machines Corporation, Armonk, NY (US)

(72) Inventors: Vikas Agarwal, Austin, TX (US); Samantak Gangopadhyay, Bangalore (IN); Shashank Joshi, Bangalore (IN); Manish Kumar, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/850,508

(22) Filed: Mar. 26, 2013

(65) Prior Publication Data

US 2014/0298282 A1    Oct. 2, 2014

(51) Int. Cl.
  *G06F 17/50*    (2006.01)
(52) U.S. Cl.
  CPC .................. *G06F 17/5031* (2013.01)
  USPC ........... 716/108; 716/100; 716/101; 716/106; 716/132; 716/134
(58) Field of Classification Search
  USPC ......... 716/100, 101, 106, 108, 110–114, 132, 716/134, 110–11
  See application file for complete search history.

(56) References Cited

U.S. PATENT DOCUMENTS

| | | | | |
|---|---|---|---|---|
| 5,878,055 | A * | 3/1999 | Allen | 714/744 |
| 6,111,444 | A * | 8/2000 | Mikan et al. | 327/211 |
| 6,696,864 | B2 * | 2/2004 | Yamashita et al. | 326/113 |
| 6,966,046 | B2 * | 11/2005 | Curran et al. | 716/104 |
| 7,131,082 | B2 * | 10/2006 | Tsukiyama et al. | 716/103 |
| 7,266,787 | B2 * | 9/2007 | Hughes et al. | 257/374 |
| 7,982,504 | B1 | 7/2011 | Robinett | |
| 7,996,812 | B2 * | 8/2011 | Kotecha et al. | 716/134 |
| 8,143,919 | B2 * | 3/2012 | Kurokawa | 326/114 |
| 8,205,182 | B1 * | 6/2012 | Zlatanovici et al. | 716/125 |
| 8,341,578 | B2 * | 12/2012 | Campbell et al. | 716/114 |
| 8,479,136 | B2 * | 7/2013 | Hopkins et al. | 716/122 |

(Continued)

FOREIGN PATENT DOCUMENTS

| | | |
|---|---|---|
| EP | 2053652 A1 | 4/2009 |
| EP | 2120267 A1 | 5/2009 |
| WO | WO0122494 A1 | 3/2001 |
| WO | WO2008014104 A2 | 1/2008 |

OTHER PUBLICATIONS

Knepper, R., "CMOS Technology Logic Circuit Synthesis", 2002, Knepper, R., Power Point Presentation, pp. 1-35.*

(Continued)

*Primary Examiner* — Stacy Whitmore
(74) *Attorney, Agent, or Firm* — Derek S. Jennings; Patent Mining Works, LLC

(57) ABSTRACT

An automated method of modifying a semiconductor chip design includes creating a timing analysis of said semiconductor chip design, identifying a plurality of gates in said semiconductor chip design which have either too fast a rising edge or falling edge, for each gate in said plurality of gates adding a stacked transistor to provide delay to the rising or falling edge of the gate. A design structure tangibly embodied in a machine readable medium for designing, manufacturing, or testing an integrated circuit, the design structure includes a CMOS device having a first transistor with a first input, a pair of stacked transistors having a second input, and an output.

16 Claims, 4 Drawing Sheets

(56) References Cited

U.S. PATENT DOCUMENTS

| | | | |
|---|---|---|---|
| 8,539,408 B1* | 9/2013 | Cheng et al. | 716/110 |
| 2001/0017418 A1 | 8/2001 | Noguchi et al. | |
| 2002/0053063 A1* | 5/2002 | Bhattacharya et al. | 716/1 |
| 2003/0231040 A1* | 12/2003 | Masleid et al. | 327/218 |
| 2003/0233628 A1* | 12/2003 | Rana et al. | 716/18 |
| 2003/0234430 A1* | 12/2003 | Friend et al. | 257/428 |
| 2007/0046330 A1 | 3/2007 | Forbes | |
| 2008/0010626 A1* | 1/2008 | Correale, Jr. | 716/17 |
| 2008/0141198 A1* | 6/2008 | Chen et al. | 716/6 |
| 2009/0011552 A1 | 1/2009 | Doris et al. | |
| 2009/0113368 A1* | 4/2009 | Lin et al. | 716/10 |
| 2009/0210841 A1* | 8/2009 | Prakash et al. | 716/6 |
| 2010/0133587 A1 | 6/2010 | Wang | |
| 2010/0169846 A1* | 7/2010 | Gupta et al. | 716/2 |
| 2010/0231263 A1* | 9/2010 | Fish et al. | 326/121 |
| 2012/0284676 A1* | 11/2012 | Hopkins et al. | 716/104 |
| 2013/0321054 A1* | 12/2013 | Gasper et al. | 327/281 |
| 2014/0040844 A1* | 2/2014 | Visweswariah et al. | 716/113 |

OTHER PUBLICATIONS

Orit Skorka, et al. "Design and Fabrication of Vertically-Integrated CMOS Image Sensors," pp. 4512-4538, Sensors 2011, 11, Published: Apr. 27, 2011.

* cited by examiner

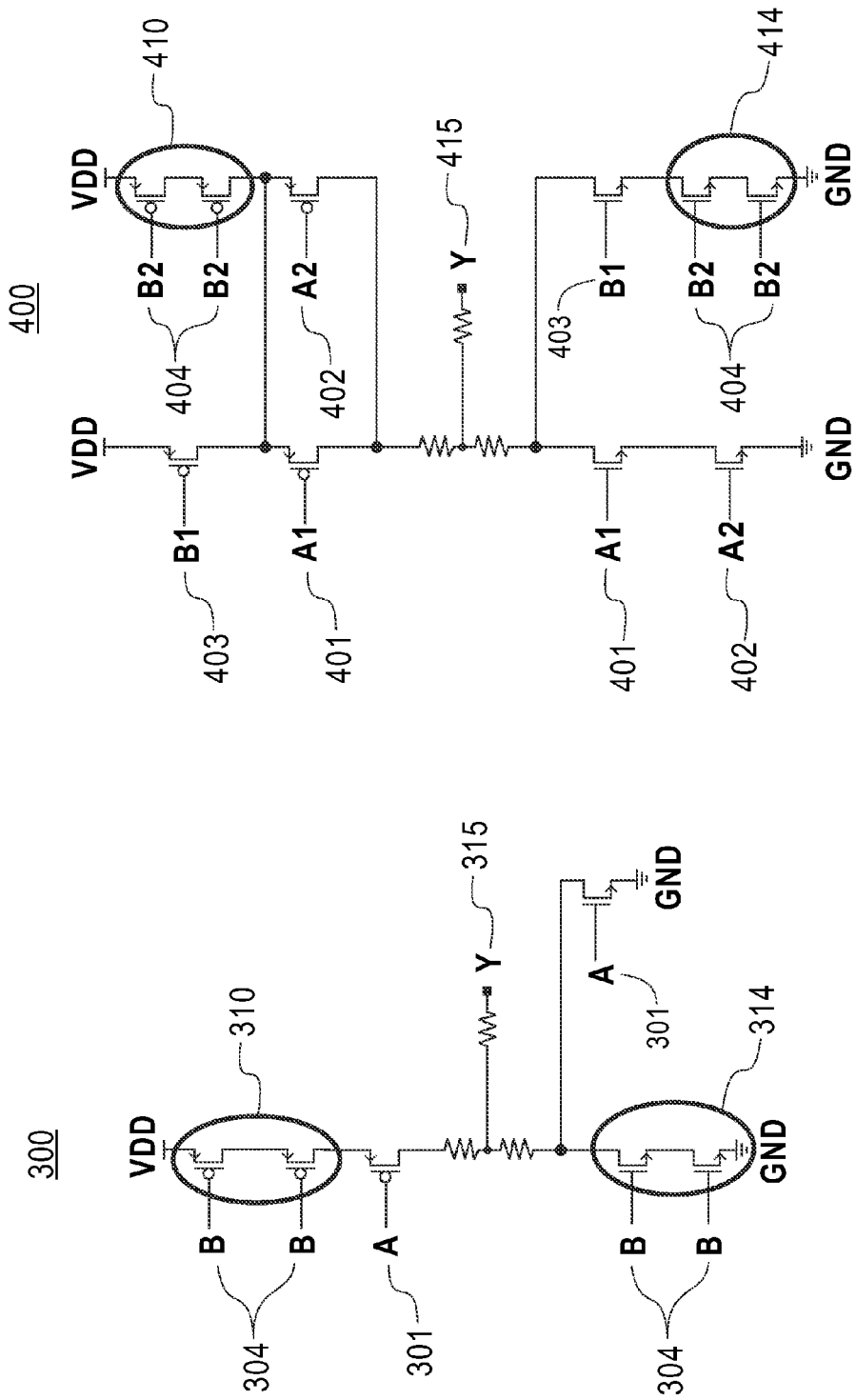

STRUCTURE FOR STACKED CMOS CIRCUITS

BACKGROUND

The present invention relates to a design structure for stacked CMOS circuits, and more specifically, to enhancing Early Mode padding in processor methodology.

SUMMARY

According to one aspect of the present invention, a method includes providing a first input to a first transistor in a CMOS device, providing a second input to a pair of stacked transistors in said CMOS device, and providing an output from said CMOS device.

According to another aspect of the present invention, an automated method of modifying a semiconductor chip design includes creating a timing analysis of said semiconductor chip design, identifying a plurality of gates in said semiconductor chip design which have either too fast a rising edge or falling edge, for each gate in said plurality of gates adding a stacked transistor to provide delay to the rising or falling edge of the gate.

According to still aspect of the present invention, an automated method of modifying a semiconductor chip design includes creating a timing analysis of said semiconductor chip design; identifying a plurality of gates in said semiconductor chip design which have hold violations; for each gate in said plurality of gates adding a pair of stacked transistor to fix hold violations.

BRIEF DESCRIPTION OF THE SEVERAL VIEWS OF THE DRAWINGS

FIG. 3 depicts an exemplary implementation according to an embodiment of the present invention.

FIG. 4 depicts an exemplary implementation according to an embodiment of the present invention.

DETAILED DESCRIPTION

Figure 2:
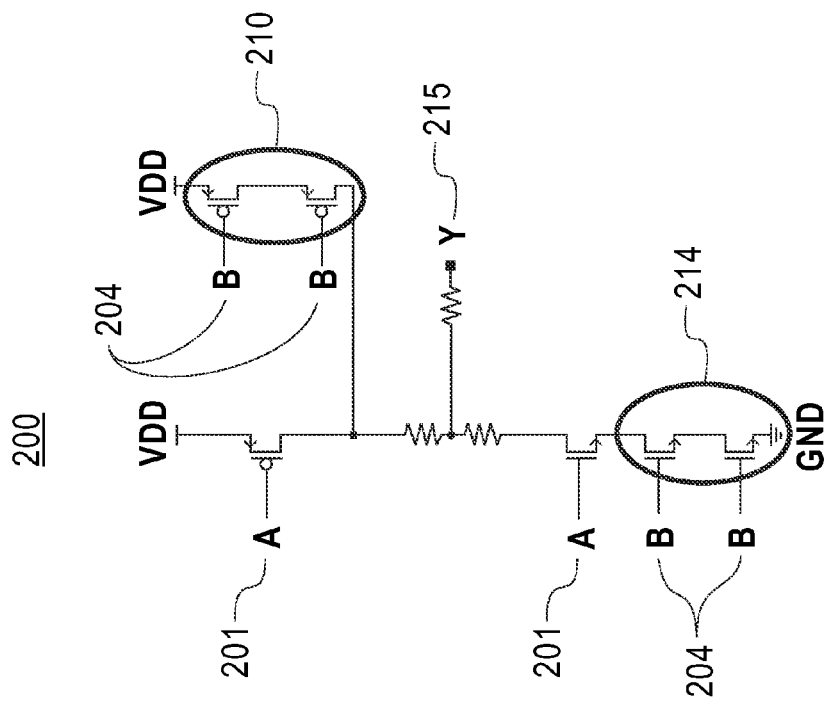
FIG. 2 depicts an exemplary implementation according to an embodiment of the present invention.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting. As will be appreciated by one skilled in the art, aspects of the present invention may be embodied as a system, method or computer program product.

The core idea according to embodiments of the invention involves the concept of stacking same type transistors in into multiple input gate devices. Embodiments of the present invention are shown in combination with universal gates NOR2 and NAND2. However, other embodiments of the present invention can be used in any multiple inputs CMOS devices, like AOI, OAI, NAND, NOR, XOR and XNOR.

The stacking introduced in the gates can be both complete i.e. on PMOS and NMOS side or it can be partial (PMOS or NMOS). In addition, the stacking can be extended to all the inputs or selectively a single input which is fast in early mode timing and causing hold violation. Early Mode Timing or Analysis is sometimes called "short path" or "fast path" analysis. Early mode propagates the earliest arrival times, that is, the smallest cumulative path delays. It tests for fast path problems (signal reaching destination before time). It identifies paths that could cause hardware to incorrectly store data into the previous clock cycle. Late Mode Timing or Analysis is sometimes called "long path" or "slow path" analysis. Late mode propagates the latest possible arrival times, that is, the longest cumulative path delays. It tests for slow path problems (signal not reaching destination in time). It identifies paths that would prevent hardware from being able to operate at desired clock cycle time.

Certain paths that have nand2 or nor2 logic and is failing hold test, could be replaced with the delay nand2/nor2 gates. Early mode errors can be fixed or improve the remaining hold failing paths.

Figure 1:
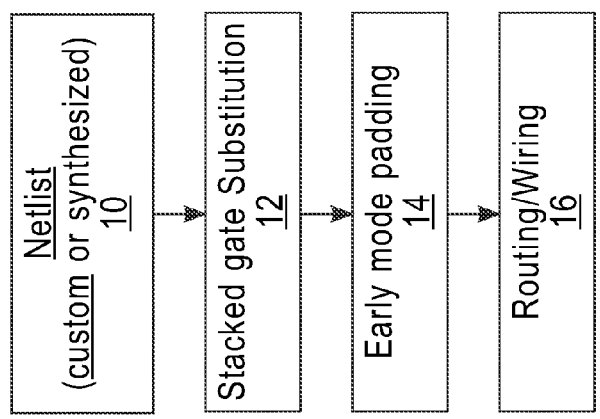
FIG. 1 illustrates a process flow in accordance with one embodiment of the present invention.

With reference now to FIG. 1, illustrated is a new methodology flow for physical design process according to an embodiment of the present invention. A netlist 10, is designed/implemented using synthesis tools or custom methods. Netlists in most cases are focused towards late mode timing and has several hold violations. An embodiment of the present invention uses stacked gate substitution 12. Exemplary embodiments of the stacked gate substitution 12 will be described in more detail with reference to the later figures. The flow process continues by adding an early mode padding (14). Early mode padding involves adding delay inverters or buffers to fix all possible hold violations. Stacked gate substitute in CMOS gates reduces hold violations without adding any new gates. and then subject the design to early mode padding Following the early mode padding 14 the process continues by conducting the routing/wiring 16.

Referring to FIG. 2, shown is exemplary implementation of stacking in a two input NAND gate 200 to fix early mode violation also known as hold violation. A hold violation occurs when valid data does not remain stable long enough while the clock is active to be properly latched into the storage element. In other words: When invalid data (or data intended for the next cycle) arrives too early for the latching of the current cycle's data to be completed. Therefore, a hold violation can cause invalid data to be captured by the flip-flop or other storage element. Stacking is pictorially demonstrated by showing the encircled stacked transistors 210 and 214. Stacking is done by replacing a transistor with a series of two transistors of the same type. This also involves shorting the source of one transistor to drain of the other and their gate input shorted together. The two signals named A (201) and B (204) are inputs to given two input NAND gate 200. Signal B is major or single contributor to hold violation through this gate. The stacked NAND gate 200 produces an output signal 215 that addresses early mode and violations.

Another embodiment according to the present invention involves a NAND gate where the stacking can be done only on the PMOS side. Adding stacked PMOS transistors to the faster inputs balances the faster input and faster rising edge.

By way of example, the timing of the signals are explained as follows. The timing of the input signals can be either too fast (hold fail) or too slow (setup fail). If the timing of the signal to is reach the gate at 300 ps and but arrives at 305 ps then the setup slack would be −5 ps. In other words, failing the setup test by 5 ps. If the timing is to reach the gate after 50 ps but reaches 45 then the hold slack would be −5 ps. In other words, failing the hold test by 5 ps.

The portion of the circuit considered for the analysis involves the nand gate 200 whose output drives eventually drives a principal output port/pin. For the delay nand, the signal arrival time at the port was 54.73 ps for the rising edge and 58.33 ps for the falling edge. The arrival time corresponds to a slack of 4.73 ps (rising edge) and 8.33 ps (falling edge). The results demonstrate that the delay nand was able to slow down the path by 3.84 ps at the rising edge and 4.58 ps at the falling edge.

Referring to FIG. 3, shown is exemplary implementation of stacking in a two input NOR gate 300 to fix early mode violation also known as hold violation. Stacking is pictorially demonstrated by showing the encircled stacked transistors 310 and 314. Stacking is done by replacing a transistor with a series of two transistors of the same type. This also involves shorting the source of one transistor to drain of the other and their gate input shorted together. The two signals named A (301) and B (304) are inputs to given two input NOR gate 300. Signal B is major or single contributor to hold violation through this gate. The stacked NOR gate 300 produces an output signal 315 that addresses early mode and violations.

Another embodiment according to the present invention involves a NOR gate where the stacking can be done only on the NMOS side. Adding stacked NMOS transistors to the faster inputs balances the faster input and faster rising edge.

Referring to FIG. 4, shown is exemplary implementation of stacking in a two input AOI gate 400 to fix early mode violation also known as hold violation. Stacking is pictorially demonstrated by showing the encircled stacked transistors 410 and 414. Stacking is done by replacing a transistor with a series of two transistors of the same type. This also involves shorting the source of one transistor to drain of the other and their gate input shorted together. The two signals named A1 and A2 (401, 402) and B1 and B2 (403, 404) are inputs to given two input AOI gate 400. Signals B1/B2 are major or single contributor to hold violation through this gate. The stacked AOI gate 400 produces an output signal 415 that addresses early mode and violations.

Another embodiment according to the present invention involves a NOR gate where the stacking can be done only on the NMOS side. Adding stacked NMOS transistors to the faster inputs balances the faster input and faster rising edge.

Figure 5:
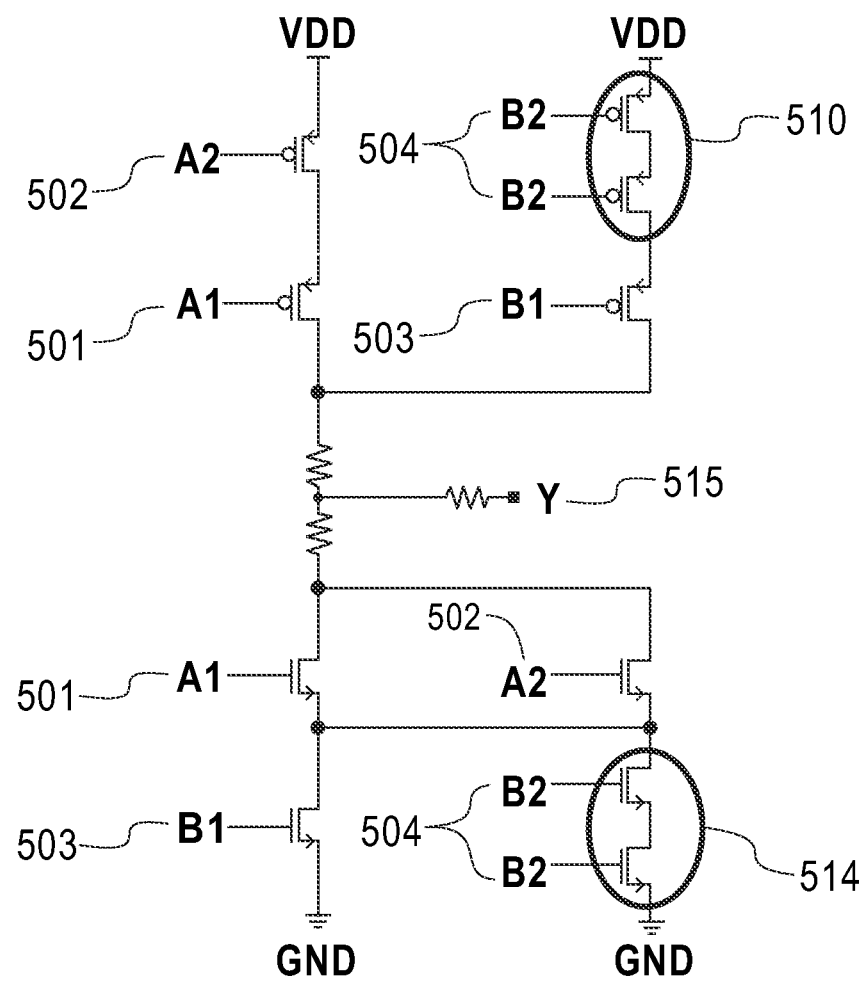
FIG. 5 depicts an exemplary implementation according to an embodiment of the present invention.

Referring to FIG. 5, shown is exemplary implementation of stacking in a two input OAI gate 500 to fix early mode violation also known as hold violation. Stacking is pictorially demonstrated by showing the encircled stacked transistors 510 and 514. Stacking is done by replacing a transistor with a series of two transistors of the same type. This also involves shorting the source of one transistor to drain of the other and their gate input shorted together. The two signals named A1 and A2 (501, 502) and B1 and B2 (503, 504) are inputs to given two input OAI gate 500. Signals B1/B2 are major or single contributor to hold violation through this gate. The stacked AOI gate 500 produces an output signal 515 that addresses early mode and violations.

Another embodiment according to the present invention involves a NOR gate where the stacking can be done only on the NMOS side. Adding stacked NMOS transistors to the faster inputs balances the faster input and faster rising edge.

Design Structure

Figure 6:
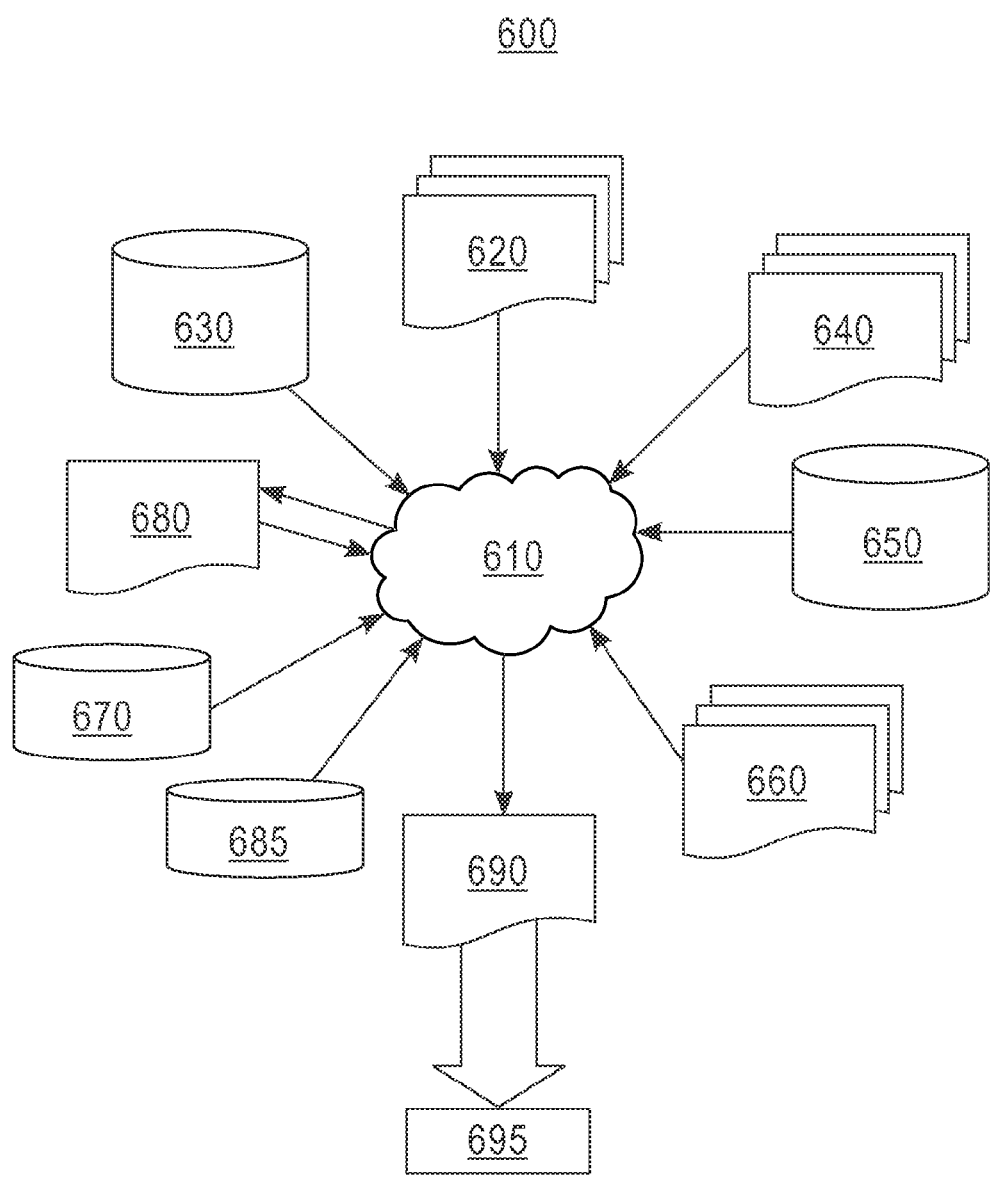
FIG. 6 depicts a design structure according to an embodiment of the present invention.

FIG. 6 shows a block diagram of another exemplary design flow 600 used for example, in semiconductor IC logic design, simulation, test, layout, and manufacture. Design flow 600 includes processes, machines and/or mechanisms for processing design structures or devices to generate logically or otherwise functionally equivalent representations of the design structures and/or devices described above and shown in FIGS. 2 and 3. The design structures processed and/or generated by design flow 600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 600 may vary depending on the type of representation being designed. For example, a design flow 600 for building an application specific IC (ASIC) may differ from a design flow 600 for designing a standard component or from a design flow 600 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission, gate array, or storage medium, design structure 620 may be accessed and processed by one or more hardware and/or software modules within design process 410 to simulate or otherwise functionally represent an electronic component, circuit, electronic or logic module, apparatus, device, or system such as those shown in FIGS. 1-3. As such, design structure 620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in FIGS. 1-3 to generate a Netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 610 may include hardware and software modules for processing a variety of input data structure types including Netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 610 without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures along with any additional mechanical design or data (if applicable), to generate a second design structure 690. Design structure 690 resides on a storage medium or programmable gate array in a data format used for the exchange of data of mechanical devices and structures (e.g. information stored in a ICES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5 In one embodiment, design structure 690 may comprise a compiled, executable HDL simulation model that functionally simulates the devices shown in FIGS. 1-5.

Design structure 690 may also employ a data format used for the exchange of layout data of integrated circuits and/or symbolic data format (e.g. information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3. Design structure 690 may then proceed to a stage 695 where, for example, design structure 690: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-aided design system uses a method for generating a functional design model of a semiconductor chip, said method comprising:

in a programmed computer creating a timing analysis of said semiconductor chip design;

identifying a plurality of gates in said semiconductor chip design which have either too fast a rising edge or falling edge; and for each gate in said plurality of gates adding a pair of stacked transistors wherein the source of one transistor is shorted to the drain of the other and their gate inputs are shorted together to provide delay to the rising or falling edge of the gate.

2. The method according to claim 1, wherein said plurality of gates are part of a CMOS logic circuit.

3. The method according to claim 2, wherein said CMOS logic circuit is a NOR gate.

4. The method according to claim 2, wherein said CMOS logic circuit is a XOR gate.

5. The method according to claim 2, wherein said CMOS logic circuit is a XNOR gate.

6. The method according to claim 2, wherein said CMOS logic circuit is a AOI gate.

7. The method according to claim 2, wherein said CMOS logic circuit is a OAI gate.

8. The method according to claim 2, wherein said CMOS logic circuit is a NAND gate.

9. A computer-aided design system uses a method for generating a functional design model of a semiconductor chip, said method comprising:

in a programmed computer, creating a timing analysis of said semiconductor chip design;

identifying a plurality of gates in said semiconductor chip design which have hold violations; and for each gate in said plurality of gates adding a pair of stacked transistors wherein the source of one transistor is shorted to the drain of the other and their gate inputs are shorted together to fix hold violations.

10. The method according to claim 9, wherein said plurality of gates are part of a CMOS logic circuit.

11. The method according to claim 10, wherein said CMOS logic circuit is a NOR gate.

12. The method according to claim 10, wherein said CMOS logic circuit is a XOR gate.

13. The method according to claim 10, wherein said CMOS logic circuit is a XNOR gate.

14. The method according to claim 10, wherein said CMOS logic circuit is a AOI gate.

15. The method according to claim 10, wherein said CMOS logic circuit is a OAI gate.

16. The method according to claim 10, wherein said CMOS logic circuit is a NAND gate.

* * * * *